United States Patent

Cummings

[15] 3,688,885

[45] Sept. 5, 1972

[54] MULTIPLE CLUTCHES FOR A TV TUNER

[72] Inventor: John G. Cummings, Cary, Ill.

[73] Assignee: Oak Electro/Netics Corp., Crystal Lake, Ill.

[22] Filed: Dec. 7, 1970

[21] Appl. No.: 95,759

[52] U.S. Cl. ................192/95, 192/48.91, 74/10.45, 192/34, 192/108

[51] Int. Cl. ..............................................F16d 21/06

[58] Field of Search...........192/48.5, 48.9, 48.91, 34, 192/38, 93 C, 95; 74/10.45

[56] References Cited

UNITED STATES PATENTS

| | | | |
|---|---|---|---|
| 3.165,001 | 1/1965 | Harper | 74/10.45 |
| 1,015,254 | 1/1912 | Whisler | 192/48.9 X |
| 2,454,122 | 11/1948 | Barger | 192/48.91 |
| 3,066,777 | 12/1962 | Hoffman | 192/93 C |

*Primary Examiner*—Benjamin W. Wyche
*Attorney*—Parker, Carter & Markey

[57] ABSTRACT

A control mechanism for a TV tuner permitting both channel selection and fine tuning by operation of a single shaft. The channel selector shaft reciprocally and concentrically mounts an actuator shaft having a conventional manual control knob. There is a coupling between the actuator shaft and the channel selector shaft providing for unitary rotation of the two shafts in the normal position of the actuator shaft. Inward movement of the actuator shaft releases the coupling with the channel selector shaft and engages a portion of the actuator shaft with the fine tuning control.

2 Claims, 5 Drawing Figures

INVENTOR.
John G. Cummings
BY Parker, Carter & Markey
Attorneys.

MULTIPLE CLUTCHES FOR A TV TUNER

SUMMARY OF THE INVENTION

The present invention relates to a control mechanism for a TV tuner and in particular to a unitary control for both channel selection and fine tuning.

A primary purpose of the invention is a control of the type described including a simply constructed reliably operable coupling between the channel selector shaft and the actuator shaft.

Another purpose is a control mechanism of the type described in which an actuator shaft is used to move a channel selector shaft in one position and to control the fine tuning in a second position.

Another purpose is a control mechanism of the type described in which inward movement of the actuator shaft releases the channel selector shaft and engages the fine tuning control of the TV tuner.

Other purposes will appear in the ensuing specification, drawings and claims.

BRIEF DESCRIPTION OF THE DRAWINGS

The invention is illustrated diagrammatically in the following drawing wherein.

DESCRIPTION OF THE PREFERRED EMBODIMENT

Figures 1, 2, 3, 4:
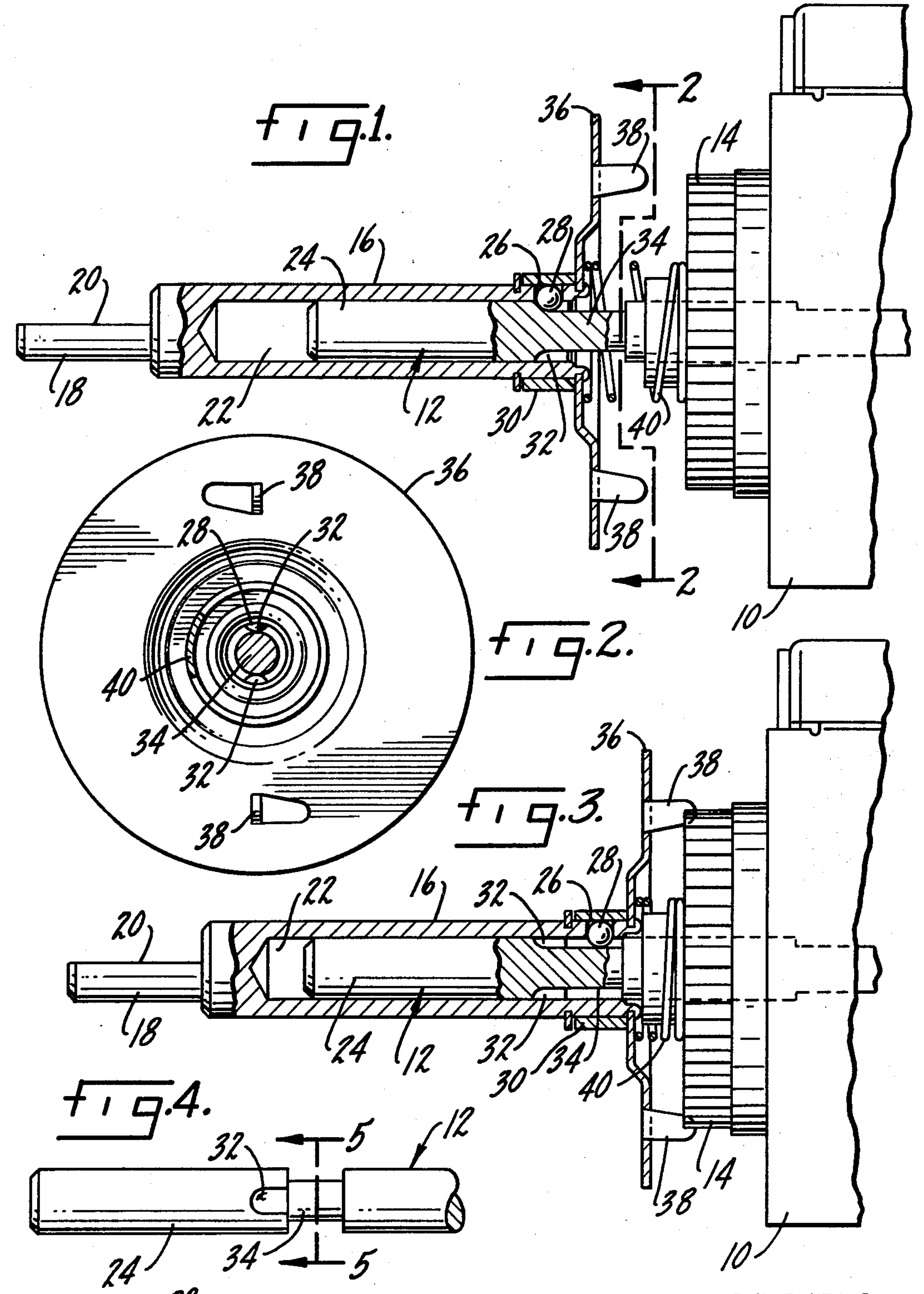
FIG. 1 is a partial side elevation of a television tuner including the control mechanism disclosed herein.
FIG. 2 is a view along plane 2—2 of FIG. 1.
FIG. 3 is a side view, similar to FIG. 1, showing the control mechanism in position to operate the fine tuning control.
FIG. 4 is a side view of a portion of the channel selector shaft.

A portion of a conventional television tuner indicated at 10 includes a channel selector shaft 12 and a fine tuning drive gear 14.

Reciprocally and concentrically mounted on the channel selector shaft 12 is an actuator shaft 16 having an extension 18 with a flat 20 on one side to receive a conventional control knob. The actuator shaft 16 has a generally central bore 22 which receives the outer end 24 of the channel selector shaft 12.

Figure 5:
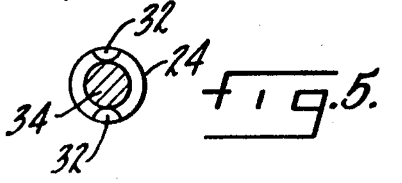
FIG. 5 is a section along plane 5—5 of FIG. 4.

There is an opening 26 in the actuator shaft 16 and a ball bearing 28 is positioned in the opening. A sleeve 30 surrounds the actuator shaft at the opening 26 and is used to hold the ball in position within the opening. The channel selector shaft 12 has a pair of oppositely disposed slots 32 positioned in alignment with the opening 26 in the position of FIG. 1. A circumferentially extending groove 34 on shaft 12 is in communication with the slots 32. Details of the construction of shaft 12 are shown in FIGS. 4 and 5.

An outwardly extending plate 36 is attached to the actuator shaft 16 adjacent sleeve 30. Plate 36 has a pair of inwardly extending projections 38 which are adapted to engage the fine tuning drive gear 14 when the actuator shaft is moved to the inward position shown in FIG. 3. A coil spring 40 surrounds the channel selector shaft 12 and has its opposite ends positioned against the drive gear 14 and the plate 36. The spring 40 normally holds the actuator shaft 16 and the plate 36 in the out or release position shown in FIG. 1.

In operation, rotation of the actuator shaft 16 by means of a control knob or the like attached to the extension 18 will turn both the actuator shaft and the channel selector shaft 12. The coupling comprising ball 28, the opening 26 in the actuator shaft 16 and the slots 32 in the channel selector shaft holds the two shafts in engagement for unitary rotation. At such time as it is desired to fine tune a particular channel, the actuator shaft 16 is pushed inwardly. Such inward movement causes the projections 38 to engage the drive gear 14 so that fine tuning may take place. Also, such inward movement of the actuator shaft 16 removes ball 28 from one of the slots 32 and moves it into the circumferentially extending groove 34. Thus, the two shafts are disengaged and subsequent rotation of the actuator shaft will cause movement of the drive gear 14. The ball 28 is free to rotate in the groove 34 and there is no coupling between the two shafts. When the actuator shaft 16 is released, spring 40 moves it outwardly. It may be necessary to slightly turn the shaft 16 at this point in order for the ball 28 to be moved into one of the two oppositely positioned slots 32. Such turning should not take place until projections 38 are moved away from drive gear 14.

Of importance in the invention is the simple, reliable and compact coupling between the actuator shaft and the channel selector shaft. The ball 28 is normally wedged between a side of one of the slots 32 and the sides of the opening 26 to hold the two shafts together for unitary rotation. Inward movement of the actuator shaft 16 releases the ball 28, moving it into the circumferentially extending groove 34 to disengage the two shafts.

Although the invention has been described in connection with a television tuner in which the movement of a single shaft is used to control both channel selection and fine tuning, it should be understood that the particular mechanical configuration and coupling arrangement may be adaptable to other applications in which rotation of a single shaft is designed to move two different control features.

Whereas the preferred form of the invention has been shown and described herein, it should be realized that there are many modifications, substitutions and alterations thereto.

I claim:

1. In a TV tuner, a channel selector shaft, an actuator shaft reciprocally and concentrically mounted on said channel selector shaft, manual control means mounted on said actuator shaft, fine tuning means, means rotatable with said actuator shaft for turning said fine tuning means including a plate extending outwardly from said actuator shaft and having means thereon adapted to engage said fine tuning means, a coil spring normally biasing said actuator shaft away from said fine tuning means, a coupling between said actuator shaft and channel selector shaft providing unitary rotation of said shafts, said coupling including an axial slot in said channel selector shaft, an opening in said actuator shaft, said channel selector shaft slot being in alignment with said opening, a circumferential groove in said channel selector shaft in communication with said slot, a ball member positioned within said opening and slot and of a size to move into said groove upon inward movement of said actuator shaft, inward axial movement of said actuator shaft moving the ball into the groove, releasing the coupling and moving said plate into engagement with said fine tuning means.

2. The structure of claim 1 further characterized in that said plate has projections attached thereto and extending toward said fine tuning means, said fine tuning means including a drive gear, with said projections being adapted to engage said drive gear.

* * * * *